United States Patent
Muterspaugh et al.

(10) Patent No.: US 9,369,107 B2
(45) Date of Patent: Jun. 14, 2016

(54) APPARATUS AND METHOD FOR FILTERING SINGALS IN A RECEIVER

(71) Applicant: THOMSON LICENSING, Issy de Moulineaux (FR)

(72) Inventors: Max Muterspaugh, Westfield, IN (US); Dan Hutchinson, Carmel, IN (US); Lincheng Xiu, Carmel, IN (US); Rejimon G. Varghese, Carmel, IN (US)

(73) Assignee: Thomson Licensing, Issy Les Moulineaux (FR)

( * ) Notice: Subject to any disclaimer, the term of this patent is extended or adjusted under 35 U.S.C. 154(b) by 0 days.

(21) Appl. No.: 14/408,014

(22) PCT Filed: Jun. 18, 2013

(86) PCT No.: PCT/US2013/046233
§ 371 (c)(1),
(2) Date: Dec. 15, 2014

(87) PCT Pub. No.: WO2013/192133
PCT Pub. Date: Dec. 27, 2013

(65) Prior Publication Data
US 2015/0303889 A1    Oct. 22, 2015

Related U.S. Application Data

(60) Provisional application No. 61/661,024, filed on Jun. 18, 2012.

(51) Int. Cl.
*H03H 7/46* (2006.01)
*H03H 7/01* (2006.01)
(Continued)

(52) U.S. Cl.
CPC ........... *H03H 7/0115* (2013.01); *H03H 7/0123* (2013.01); *H03H 7/075* (2013.01);
(Continued)

(58) Field of Classification Search
CPC ... H03H 7/0115; H03H 7/0123; H03H 7/075; H03H 7/175; H03H 7/1758; H03H 7/1766; H03H 7/1783; H03H 7/1791; H04B 1/16
USPC ........................................................ 333/132
See application file for complete search history.

(56) References Cited

U.S. PATENT DOCUMENTS 5,548,255 A    8/1996    Spielman
7,340,237 B2   3/2008    Sheng-Fuh et al.
(Continued)

FOREIGN PATENT DOCUMENTS

CN    101609915    12/2009
EP    2207237      7/2009
(Continued)

OTHER PUBLICATIONS

Romani et al, "Compact Microstrip Bandpass Filter with Enhanced Stopband Performances," Dept. of Electrical Engineering, Univ. of Brasilia, 2007 SBMO/IEEE MTT-S International Microwave & Optoelectronics Conference.
(Continued)

*Primary Examiner* — Robert Pascal
*Assistant Examiner* — Kimberly Glenn
(74) *Attorney, Agent, or Firm* — Robert D. Shedd; Vincent E. Duffy; Michael A. Pugel

(57) ABSTRACT

An apparatus and method for filtering a signal is described. The apparatus includes a first singly terminated filter that filters a signal in a first frequency range, and a second singly terminated filter that filters the signal in a second frequency range, the inputs of the filters being connected together, wherein an element of the first filter is coupled to an additional element to form a frequency response transmission zero in a stopband frequency range of the first filter. The method includes receiving a signal, the signal containing content from a first source in a first frequency range and content from a second source in a second frequency range different than the first range, applying filtering, and applying filtering to generate a second output signal, using filters that include a singly terminated filter section with additional circuit elements to form a transmission frequency zero in the stopband frequency range.

62 Claims, 10 Drawing Sheets

(51) Int. Cl.
*H03H 7/075* (2006.01)
*H04B 1/16* (2006.01)

(52) U.S. Cl.
CPC ............... *H03H 7/466* (2013.01); *H04B 1/16* (2013.01); *H03H 7/175* (2013.01); *H03H 7/1758* (2013.01); *H03H 7/1766* (2013.01); *H03H 7/1783* (2013.01); *H03H 7/1791* (2013.01)

(56) References Cited

U.S. PATENT DOCUMENTS

| 7,719,382 | B2 | 5/2010 | Tsuzuki et al. | |
|---|---|---|---|---|
| 2010/0171565 | A1 | 7/2010 | Okada | |
| 2011/0010749 | A1 | 1/2011 | Alkan | |
| 2011/0018654 | A1* | 1/2011 | Bradley | H03H 9/725 333/133 |
| 2011/0281543 | A1 | 11/2011 | White et al. | |

FOREIGN PATENT DOCUMENTS

| JP | 2000196482 | 7/2000 |
|---|---|---|
| JP | 2008278100 | 11/2008 |
| JP | 2010141589 | 6/2010 |

OTHER PUBLICATIONS

Chuang et al, "A Compact Printed Filtering Antenna Using a Ground-Intruded Coupled Line Resonator," IEE Transactions on Antennas and Propagation, vol. 59, No. 10, Oct. 2011.

Rhodes, et al, "The Generalized Chebyshev Low-Pass Prototype Filter," Department of Electrical and Electronic Engineering, University of Leeds, Leeds LS2 9JT, England, Circuit Theory and Applications, vol. 8, 113-125 (1980).

Koyaz et al., "Design of diplexers with maximally flat response and frequency symmetry", 7th IEEE Mediterranean ElectroTechnical Conference, Apr. 12, 1994, pp. 512-515.

Levy, "Filters with Single Transmission Zeros at Real or Imaginary Frequencies," IEEE Transactions on Microwave Theory and Techniques, vol. MTT-24, No. 4, Apr. 1976.

Hong, "Design of Highly Selective Microstrip Bandpass Filters with a Single Pair of Attenuation Poles at Finite Frequencies," IEE Transactions on Microwave Theory and Techniques, vol. 48, No. 7, Jul. 2000.

WO Search Report dated Sep. 16, 2013.

* cited by examiner

APPARATUS AND METHOD FOR FILTERING SINGALS IN A RECEIVER

REFERENCE TO RELATED PROVISIONAL APPLICATION

This application claims the benefit, under 35 U.S.C. §365 of International Application PCT/US2013/046233, filed Jun. 18, 2013, which was published in accordance with PCT Article 21(2) on Dec. 27, 2013 in English and which claims the benefit of U.S. provisional patent application No. 61/661,024, filed Jun. 18, 2012.

TECHNICAL FIELD OF THE INVENTION

The present disclosure generally relates to a communication apparatus that includes circuits for receiving signals from a plurality of sources. More particularly, the present disclosure is related to a multiplex filter used in a receiver device that includes receiving multiple of types of signals, such as satellite, cable, terrestrial, and home network signals, in different frequency ranges.

BACKGROUND OF THE INVENTION

This section is intended to introduce the reader to various aspects of art, which may be related to the present embodiments that are described below. This discussion is believed to be helpful in providing the reader with background information to facilitate a better understanding of the various aspects of the present disclosure. Accordingly, it should be understood that these statements are to be read in this light.

Many home entertainment devices not only include the capability to communicate with other devices in a home network but also include the ability to receive and/or process available media content from a plurality of sources, including a plurality of providers. The sources and providers may include, but are not limited to, satellite service, cable service, and free to home over the air terrestrial service. The services may operate in the same or different frequency ranges and may use the same or different transmission formats or protocols. The devices for receiving the services often include, but are not limited to, set-top boxes, gateways, televisions, home computers, and the like. Further, many of these devices may include multiple interfaces for different types of externally provided services as well as different types of home networks. These devices may also include additional features internal to the device, such as storage elements, hard drives, compact disk or digital versatile disk drives, and the like.

In order to receive signals from these different services simultaneously, a filtering structure, such as a multiplex filter, is often used to separate the signals. These filtering structures are particularly important if the services operate in separate frequency ranges and/or use separate transmission formats or protocols. For example, a multiplex filter allows the reception of multiple transmission systems, including terrestrial systems complying with Digital Video Broadcasting television standard (DVB-T2) or the Integrated Services Digital Broadcasting television standard (ISDBT) may be included along with reception of satellite signals. A diplex filter, a type of multiplex filter, is often comprised of a high pass filter for a first high frequency band (e.g., a satellite signal frequency band) and a low pass or band pass filter for a second lower frequency band (e.g., a terrestrial or cable broadcast frequency band).

However, a system receiving multiple signals from multiple services over a wide range of frequencies creates significant difficulties in creating a suitable diplex or multiplex filter that provides optimal performance for all services. Previous designs often did not require the additional filtering functions to receive certain terrestrial (e.g., DVB-T2 or ISDBT) broadcast signals along with satellite signals on a common coaxial cable input. The design may be further complicated by the inclusion of an interface to a wired home communication network, such as Multimedia over Cable Alliance (MoCA) network. For example, frequency guard bands between the frequency ranges for the terrestrial and satellite services may be small in frequency range requiring more selectivity from the filter sections. Further, unused frequency bands between the filters in which undesirable characteristics from the filter sections may be tolerated may not be present. Additionally, systems that did include unused frequency ranges and guard bands may still require a high amount of rejection for signals that are in the frequency range outside of the desired frequency range. Filters used in these systems may still not provide sufficient stopband frequency rejection or may introduce undesired frequency anomalies in the passband frequency response due to interaction between filter sections of a diplex or multiplex filter. Therefore, there is a need for a more optimal filtering structure that allows for reception of multiple signals in separate frequency ranges.

SUMMARY

According to an aspect of the present disclosure, a method for filtering a signal is described. The method includes receiving a signal, the signal containing content from a first source in a first frequency range and content from a second source in a second frequency range, the second frequency range being different than the first frequency range, applying filtering, using first processing circuitry, to the received signal to produce a first output signal containing the content from the first source, applying filtering, using second processing circuitry coupled to the first processing circuitry, to the received signal to produce a second output signal containing the content from the second source, wherein at least one of the first processing circuitry and the second processing circuitry uses a filter that includes a singly terminated filter section with additional circuit elements to form a transmission frequency zero in the stopband frequency range of the filter.

According to an aspect of the present disclosure, an apparatus for filtering a signal is described. The apparatus includes a first filter, the first filter being singly terminated with respect to one of an input and an output of the first filter, the first filter filtering a received signal in a first frequency range, and a second filter, the second filter being singly terminated with respect to one of an input and an output of the first filter, the input of the second filter being connected to the input of the first filter, the second filter filtering the received signal in a second frequency range, wherein at least one element of the first filter is coupled to an additional element to form a frequency response transmission zero in the stopband frequency range of the first filter.

BRIEF DESCRIPTION OF THE DRAWINGS

These, and other aspects, features and advantages of the present disclosure will be described or become apparent from the following detailed description of the preferred embodiments, which is to be read in connection with the accompanying drawings.

Figure 1:
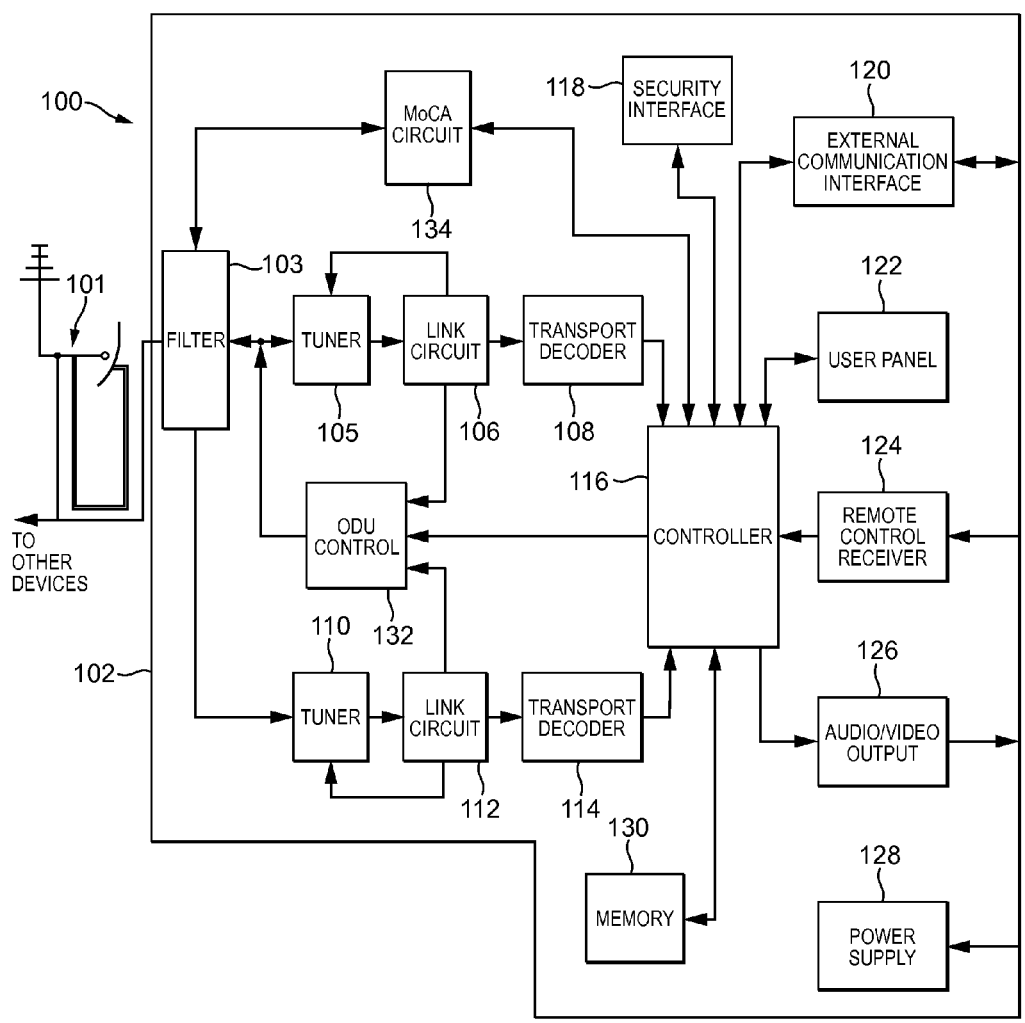
FIG. 1 is a block diagram of an exemplary system for receiving broadcast media content in accordance with the present disclosure.

It should be understood that the drawing(s) are for purposes of illustrating the concepts of the disclosure and is not necessarily the only possible configuration for illustrating the disclosure.

DETAILED DESCRIPTION OF PREFERRED EMBODIMENTS

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces. Herein, the phrase "coupled" is defined to mean directly connected to or indirectly connected with through one or more intermediate components. Such intermediate components may include both hardware and software based components.

The present description illustrates the principles of the present disclosure. It will thus be appreciated that those skilled in the art will be able to devise various arrangements that, although not explicitly described or shown herein, embody the principles of the disclosure and are included within its scope.

All examples and conditional language recited herein are intended for educational purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read only memory (ROM) for storing software, random access memory (RAM), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

The present disclosure is directed at problems associated with achieving a desired frequency response for one or more filter sections when requirements place severe restrictions on a multiplex filter design capable of receiving a plurality of signals from a plurality of different sources. Conventional design methods for multiplex filters may use a class of filter often referred to as a singly-terminated filter often based on a Butterworth or Chebyshev design. The filters are individually designed as singly terminated Butterworth or Chebyshev types with a low input impedance and the desired system output impedance. The low impedance inputs are then connected together. The result is a multiplex filter with the desired system input impedance as well as good return loss at the input over the frequency bands of the several filters. In order to achieve the performance the frequency bands must not overlap and should also provide sufficient guard band frequency ranges and/or filter selectivity requirements.

However, in designs with smaller guardbands between frequency ranges or more stringent filtering requirements, such as higher requirements for stopband frequency rejection, the selectivity performance of the singly terminated filters in present applications is often insufficient. The additional use of elliptic filters offers more stopband frequency rejection or selectivity for use with smaller guard bands. However, elliptical filters often also may produce severe interaction with certain important signal characteristics resulting in anomalies in the desired pass bands of one or more of the filter sections in a multiplex filter. The present disclosure addresses these issues using a hybrid filtering approach that offers an improvement in selectivity and stopband frequency rejection while minimizing or eliminating passband anomalies.

The present embodiments describe a method and apparatus for filtering a signal in a receiver. In particular, the embodiments describe a multiplex filter design that provides a high level of rejection of signals from a service in one frequency range while passing signals from a service in a second frequency range. The multiplex filter described below includes a first portion that is a high pass filter for operation in a first frequency range (e.g., satellite L-band frequency). The multiplex filter also includes a second portion that operates as a bandpass filter for a second frequency range (e.g., terrestrial television frequency). The bandpass filter may be constructed as a combination of a high pass filter and a low pass filter. The multiplex filter may also include a third filter for interfacing to a home network, such as a multimedia over cable alliance (MoCA) network. The third filter operates as a bandpass filter in a frequency range between the first frequency range and the second frequency range. The multiplex filter may further include a switching arrangement for operation in a plurality of filtering modes.

The present embodiments further describe filter structures that utilize singly terminated filters, such as filters based on a Butterworth or Chebyshev design and further include one or more transmission stopband frequency zeroes included in the filter structure. The circuit elements used to form the transmission stopband frequency zeroes are positioned in the filter structure such that the stopband frequency zeroes have a minimal effect on the passband frequency of the same filter section or any other filter sections coupled in a manner to the same filter. The design aspects of the present embodiments are well suited for use in multiplex filter designs. However, the same design aspects may also apply to conventional signal filters used in communication circuits.

Turning now to the drawings and referring initially to FIG. 1, an exemplary embodiment of a system 100 for receiving signals using aspects of the present invention is shown. System 100 primarily receives signals from one or more satellites as well as multiple television broadcast transmission sites. The signals are provided by one or more service providers and represent broadcast audio and video programs and content. System 100 is described as including components that reside both inside and outside a user's premises. It is important to note that one or more components in system 100 may be moved from inside to outside the premises. Further, one or more components may be integrated with a display device, such as a television or display monitor (not shown). In either case, several components and interconnections necessary for complete operation of system 100 are not shown in the interest of conciseness, as the components not shown are well known to those skilled in the art.

An outdoor unit (ODU) 101 receives signals from satellites and from terrestrial transmission towers through an over the air and/or near earth orbit communications link. ODU 101 is connected to set top box 102. Within set top box 102, the input is connected to filter 103. Filter 103 connects to three signal processing paths. A first path includes tuner 105, link circuit 106, and transport decoder 108 connected together serially. A second path includes tuner 110, link circuit 112, and transport decoder 114 connected together serially. A third path includes MoCA circuit 134 which further connects to controller 116. The outputs of transport decoder 108 and transport decoder 114 each connect to controller 116. Controller 116 connects to security interface 118, external communication interface 120, user panel 122, remote control receiver 124, audio/video output 126, power supply 128, memory 130, and ODU control 132. External communication interface 120, remote control receiver 124, audio/video output 126, and power supply 128 provide external interfaces for the set top box 102. ODU control 132 also connects to the filter 103.

Satellite signal streams, each containing a plurality of channels, are received by ODU 101. ODU 101 includes a dish for capturing and focusing the propagated radio wave from the atmosphere onto one or more antennas contained within a structure known as a low noise block converter (LNB). ODU 101 may be configured to receive the signal streams from satellite transponders located on one or more satellites. In a preferred embodiment, two sets of sixteen channels are received by ODU 101, and converted, using one or more LNBs to a frequency range of 950 Megahertz (MHz) to 2,150 MHz, referred to as L-band. ODU 101 also includes a terrestrial antenna for receiving over the air broadcasts. In a preferred embodiment, ODU 101 includes a multiple element antenna array for receiving ISDBT signals in the frequency range from 170 MHz to 800 MHz.

ODU 101 provides a converted signal stream to the set top box 102 through radio frequency (RF) co-axial cable. The converted signal stream is provided to filter 103. In a preferred embodiment, filter 103 operates as a multiplex filter with up to three separate filter sections or interfaces. The frequency response properties of filter 103 may include a separate highpass filter and lowpass filter such that the frequency passbands of each do not overlap. The arrangement, often referred to as a diplexer or diplex filter, allows for a separation, through signal filtering, of the incoming satellite signal and/or MoCA signal from the terrestrial signal and/or MoCA signal. In a preferred embodiment, the low pass filter frequency response pass band ends at a frequency below 900 MHz. The low pass filter portion allows a MoCA signal in a frequency range from 475 MHz to 625 MHz as well as a terrestrial signal in the frequency range from 170 MHz to 800 MHz to pass through to subsequent blocks while attenuating, or not passing through, a satellite signal in a frequency range from 950 MHz to 2,150 MHz. The high pass filter portion operates in an opposite manner passing the MoCA signal, in the frequency range around 1100 MHz, along with the satellite signal through and attenuating cable or terrestrial broadcast signal. The high pass filter portion may also filter any electrical supply or communication signals provided to the ODU 101. An additional bandpass filter circuit may be provided to further process MoCA signals and provide the signals as an output to a home MoCA network or for processing in set top box 102. Other embodiments may be possible and some of these embodiments are described in further detail below. Filter 103 may also include surge or transient voltage protection devices.

The output signal from the high pass filter portion of filter 103 is provided to a first signal path containing a tuner 105, a link circuit 106, and a transport decoder 108 connected in a serial fashion. The output signal from the low pass filter portion of the filter 103 is provided to a second signal path. The second signal path also contains a tuner 110, a link circuit 112, and a transport decoder 114 connected in a serial fashion. Each processing path may perform similar processing on the filtered signal streams, the processing being specific to the transmission protocol used.

Tuner 105 processes the split signal stream by selecting or tuning one of the channels provided from a satellite service provider in the highpass filtered signal stream to produce one or more baseband signals. Tuner 105 contains circuits (e.g., amplifiers, filters, mixers, and oscillators) for amplifying, filtering and frequency converting the satellite signal stream. Tuner 105 typically is controlled or adjusted by link circuit 106. Alternately, tuner 105 may be controlled by another controller, such as controller 116, which will be described later. The control commands include commands for changing the frequency of an oscillator used with a mixer in tuner 105 to perform the frequency conversion.

Tuner 110 processes the lowpass filtered signal stream by selecting or tuning one of the terrestrial or cable broadcast channels in the split signal stream to produce one or more baseband signals. Tuner 110 contains circuits (e.g., amplifiers, filters, mixers, and oscillators) for amplifying, filtering and frequency converting the signal stream. Tuner 110 may controlled or adjusted in a manner similar to that described earlier for tuner 105.

Typically the baseband signals at the output of tuner 105 or tuner 110 may collectively be referred to as the desired received signal and represent one satellite channel selected out of a group of channels that were received as the input signal stream. Although the signal is described as a baseband signal, this signal may actually be positioned at a frequency that is only near to baseband.

The one or more baseband signals from the satellite service provider are provided to link circuit 106 through tuner 105. Link circuit 106 typically contains the processing circuits needed to convert the one or more baseband signals into a digital signal for demodulation by the remaining circuitry of link circuit 106. In one embodiment the digital signal may represent a digital version of the one or more baseband signals. In another embodiment the digital signal may represent the vector form of the one or more baseband signals. Link circuit 106 also demodulates and performs error correction on the digital signal from the satellite service provider to produce a transport signal. The transport signal may represent a data stream for one program, often referred to as a single program transport streams (SPTS), or it may represent multiple program streams multiplexed together, referred to as a multiple program transport stream (MPTS).

The one or more baseband signals from the broadcast service provider are provided to link circuit 112 through tuner 110. Link circuit 112 typically contains the processing circuits needed to convert the one or more baseband signals into a digital signal for demodulation by the remaining circuitry of link circuit 112 in a manner similar to link circuit 106 described earlier. Link circuit 112 also demodulates, performs broadcast channel equalization error correction on the digital signal from the broadcast service provider to produce a transport signal. As described earlier, the transport signal may represent a data stream for one program or it may represent multiple program streams multiplexed together.

The transport signal from link circuit 106 is provided to transport decoder 108. Transport decoder 108 typically separates the transport signal, which is provided as either a SPTS or MPTS, into individual program streams and control signals. Transport decoder 108 also decodes the program streams, and creates audio and video signals from these decoded program streams. In one embodiment, transport decoder 108 is directed by user inputs or through a controller such as controller 116 to decode only the one program stream that has been selected by a user and create only one audio and video signal corresponding to this one decoded program stream. In another embodiment, transport decoder 108 may be directed to decode all of the available program streams and then create one more audio and video signals depending on user request.

The transport signal from link circuit 112 is similarly provided to transport decoder 114. Transport decoder 114 decodes the program streams, and creates audio and video signals from these decoded program streams as directed by user inputs or a controller in a manner similar to that described earlier for transport decoder 108.

The audio and video signals, along with any necessary control signals, from both transport decoder 108 and transport decoder 114 are provided to controller 116. Controller 116 manages the routing and interfacing of the audio, video, and control signals and, further, controls various functions within set top box 102. For example, the audio and video signals from transport decoder 108 may be routed through controller 116 to an audio/video (A/V) output 126. A/V output 126 supplies the audio and video signals from set top box 102 for use by external devices (e.g., televisions, display monitors, and computers). Also, the audio and video signals from transport decoder 114 may be routed through controller 116 to memory block 130 for recording and storage.

Memory block 130 may contain several forms of memory including one or more large capacity integrated electronic memories, such as static random access memory (SRAM), dynamic RAM (DRAM), or hard storage media, such as a hard disk drive or an interchangeable optical disk storage system (e.g., compact disk drive or digital video disk drive). Memory block 130 may include a memory section for storage of instructions and data used by controller 116 as well as a memory section for audio and video signal storage. Controller 116 may also allow storage of signals in memory block 130 in an alternate form (e.g., an MPTS or SPTS from transport decoder 108 or transport decoder 114).

Controller 116 is also connected to an external communications interface 120. External communication interface 120 may provide signals for establishing billing and use of the service provider content. External communications interface 120 may include a phone modem for providing phone connection to a service provider. External communications interface 120 may also include an interface for connection to an Ethernet network and/or to home wireless communications network. The Ethernet network and/or home wireless network may be used for communication data, audio, and/or video signals and content to and from other devices connected to the Ethernet network and/or home wireless network (e.g., other media devices in a home).

Controller 116 also connects to a security interface 118 for communicating signals that manage and authorize use of the audio/video signals and for preventing unauthorized use. Security interface 118 may include a removable security device, such as a smart card. User control is accomplished through user panel 122, for providing a direct input of user commands to control the set top box and remote control receiver 124, for receiving commands from an external remote control device. Although not shown, controller 116 may also connect to the tuners 105, 110, link circuits 106, 112, and transport decoders 108, 114 to provide initialization and set-up information in addition to passing control information between the blocks. Finally, power supply 128 typically connects to all of the blocks in set top box 102 and supplies the power to those blocks as well as providing power to any of the elements needing power externally, such as the ODU 101.

Controller 116 also controls ODU control 132. ODU control 132 provides signaling and power supply electrical power back to the ODU 101 through filter 103. ODU control 132 provides these signals and power onto the co-axial cable(s) running between ODU 101 and set top box 102. In one embodiment, the ODU control 132 receives input control signals from controller 116 and provides different DC voltage levels to specific portions of the ODU 101 to provide a certain signal stream containing a set of programs or content to filter 103 and further to tuner 105 and tuner 110. In another embodiment, the ODU control 132 receives inputs from controller 116 and also from link circuit 106 and link circuit 112 and provides DC voltage levels and a separate tuning control signal to ODU 101 using low frequency carrier based frequency shift keying modulation. Controller 116 also may send control commands to disable ODU controller 130 from providing either direct current (DC) voltages or control signals to ODU 101.

MoCA circuit 134 amplifies and processes the MoCA signal both for reception and transmission. As described above the MoCA interface permits communications of audio and video signals in a home network and may operate bi-directionally. MoCA circuit 134 includes a low noise amplifier for improving reception performance of a MoCA signal received by signal receiving device 100 from another network connected device. The received and amplified signal is tuned, demodulated, and decoded. The decoded signal may be provided to a number of other circuits, including audio and video outputs as well as a mass storage device (e.g., hard disk drive, optical drive, and the like), not shown. Additionally, MoCA circuit 134 generates and formats the MoCA transmit signal using audio and video content available in signal receiving device, including content received from the input (e.g., satellite signal) and content from the mass storage device. MoCA circuit 134 also includes a power amplifier for increasing the transmitted signal level of the MoCA signal sent by signal receiving device 100 to another network connected device. Adjustment of the receive signal amplification as well as the transmit signal amplification in MoCA circuit 134 may be controlled by controller 116.

It should be appreciated by one skilled in the art that the blocks described inside set top box 102 have important interrelations, and some blocks may be combined and/or rearranged and still provide the same basic overall functionality. For example, transport decoder 108 and transport decoder 114 may be combined and further integrated along with some or all of the functions of controller 116 into a System on a Chip (SoC) that operates as the main controller for set top box 102. Further, control of various functions may be distributed or allocated based on specific design applications and requirements. As an example, link circuit 106 may provide control signals to ODU control 132 and no connection may exist between link circuit 112 and ODU control 132.

Further, it should be appreciated although ODU 101 includes both a dish and LNB for use with satellite signals and a terrestrial antenna, other embodiments may use separate structures. In some embodiments, the satellite dish and LNB and included in one structure and the terrestrial antenna is part of a second structure. The outputs of both satellite dish/LNB structure and terrestrial antenna are combined using a signal combining circuit and provided to set top box 102.

Although set top box 102 is described above as receiving a single converted signal stream, set top box 102 may also be configured to receive two or more separate converted signal streams supplied by ODU 101 in some modes of operation. Operation in these modes may include additional components including switches and/or further tuning and signal receiving components, not shown. Further, set top box 102 may be designed to operate only on a home network using the Ethernet or home wireless network interfaces described above. In this case, the elements associated with operation in a MoCA network may be removed from set top box 102.

As discussed earlier, conventional methods for designing multiplex filters, such as filter 103, may use a class of filters often referred to as singly-terminated Butterworth or Chebyshev designs. The selectivity of these singly terminated filters in embodiments requiring significant stopband rejection requirements may be insufficient. The use of elliptic filters offers more selectivity and stopband rejection. However, elliptical filters also may produces severe interactions resulting in anomalies in the desired pass bands of one or more of the filter sections in a multiplex filter. In order to overcome these shortcomings, filter 103 may be designed as a hybrid filter that includes singly terminated filters for a portion of the filters and further includes additional resonant circuits to increase the selectivity of the filters. Further details for the design of multiplex filters using this hybrid filter design approach will be described in further detail below.

Figure 2:
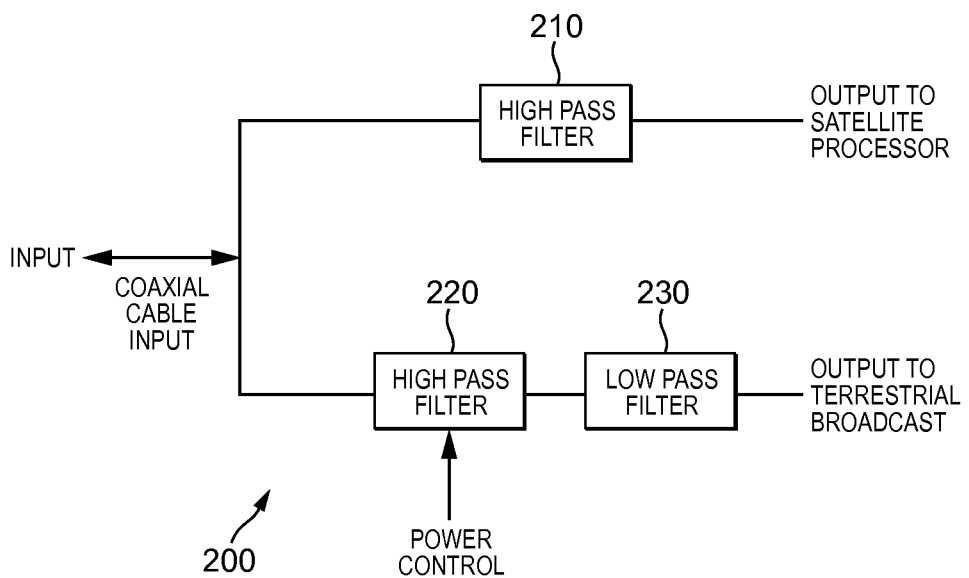
FIG. 2 is a block diagram of an exemplary diplex filter in accordance with the present disclosure.

Turning to FIG. 2, a block diagram of a diplex filter 200 used in a receiving device according to aspects of the present disclosure is shown. Diplex filter 200 includes one input and provides two outputs or interfaces. The operation of the filter sections for each of the outputs produce separate output signals that operate in different frequency ranges. Diplex filter 200 may further operate in a manner similar to filter 103 described in FIG. 1.

Diplex filter 200 includes highpass filter 210 and highpass filter 220 connected to an input. The output of highpass filter 210 is provided to other circuits for receiving satellite signals (e.g., tuner 105 described in FIG. 1). The output of highpass filter 220 is connected to lowpass filter 230. The output of lowpass filter 230 is provided to other circuits for receiving terrestrial or cable broadcast signals (e.g., tuner 110 described in FIG. 1). Highpass filter 220 also receives an input for electrical power and communication signals for operating an external device associated with receiving the satellite signals (e.g., ODU 101 described in FIG. 1).

The received signal at the input to diplex filter 200 includes both satellite and terrestrial or cable broadcast signals. Highpass filter 210 passes satellite signals with frequencies above 950 MHz for satellite signal processing. Highpass filter 210 rejects or attenuates the terrestrial or cable broadcast signals and prevents these signals from appearing at the first output. The terrestrial or cable broadcast signals are filtered and passed through the series structure of highpass filter 220 and lowpass filter 230. Satellite signals are rejected or attenuated, preventing these signals from appearing at the second output. The structure forms a bandpass filter comprised of highpass filter 220 with a cut off frequency of 170 MHz and lowpass filter 230 with a cut off frequency of 806 MHz. Diplex filter 200 may also include a connection for electrical power and communication to external circuits (e.g., an outdoor receiving unit for the satellite signals).

In order to improve the stopband rejection of one or more of the filter sections (e.g., highpass filter 210, highpass filter 220, and lowpass filter 230) the conventional filter design for the filter sections may be improved by adding transmission stopband zeroes as circuit elements. Alternatively, certain elements in the filter sections may be adjusted or augmented to create one or more transmission stopband zeroes. In order to prevent interactions and other circuit anomalies for frequency response in the filter sections, the of the circuit elements in the filter sections for the creation of the transmission stopband are located at the opposite end of the filter from the common connection point (i.e., the connection between highpass filter 210 and highpass filter 220).

Figure 3:
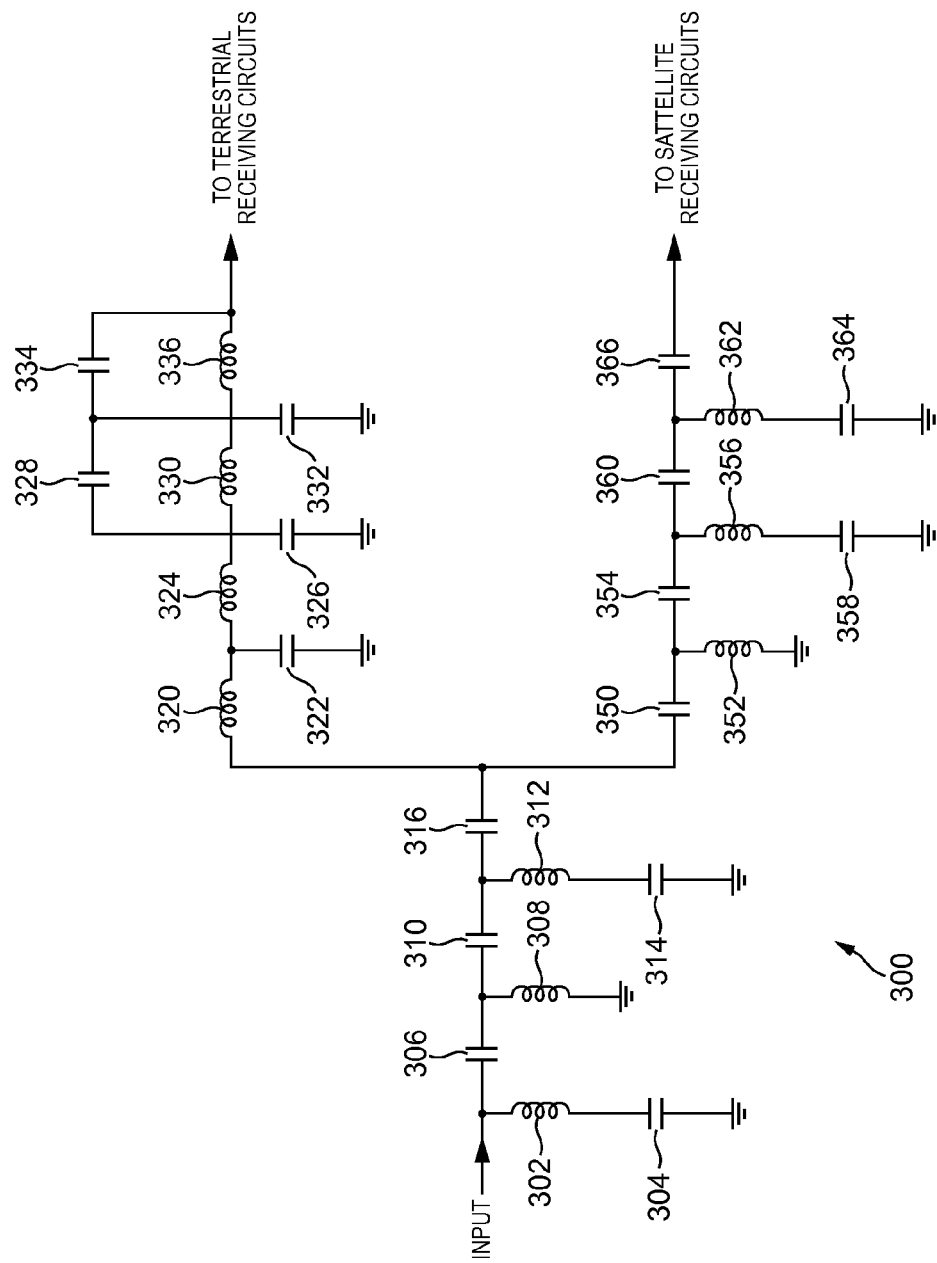
FIG. 3 is a circuit diagram of an exemplary diplex filter used in accordance with the present disclosure.

Turning to FIG. 3, a circuit diagram of a diplex filter 300 used in a receiving device according to aspects of the present disclosure is shown. Diplex filter 300 is similar to diplex filter 200 described in FIG. 2. Diplex filter 300 may further operate in a manner similar to filter 103 described in FIG. 1. Diplex filter 300 may address issues related to operational and performance effects caused by interaction between the filters used to receive the satellite and terrestrial broadcast portions of the signal. In particular, diplex filter 300 further addresses issues related to achieving high selectivity in the stopband frequency range of one or more of the filter sections while minimizing the response interactions and anomalies between the filter sections.

In diplexer 300, the input is provided to one end of element 302 and 306. The other end of element 302 further connects to one end of element 304. The other end of element 304 connects to ground. The other end of element 306 further connects to one end of both element 308 and element 310. The other end of element 308 connects to ground. The other end of element 310 is connected to one end of both element 312 and element 316. The other end of element 312 further connects to one end of element 314. The other end of element 314 connects to ground. The other end of element 316 connects to one end of both element 320 and element 350.

The other end of element 320 connects to one end of both element 322 and element 324. The other end of element 322 connects to ground. The other end of element 324 connects to one end of element 326 and also connects to one end of elements 328 and 330 arranged in parallel. The other end of element 326 connects to ground. The other ends of elements 328 and 330 further connect to one end of element 332 and also connect to one end of element 334 and element 336 arranged in parallel. The other end of element 334 and element 336 provides an output for use with additional terrestrial television broadcast receiving circuits.

The other end of element 350 further connects to one end of both element 352 and element 354. The other end of element 352 connects to ground. The other end of element 354 connects to one end of both element 356 and element 360. The other end of element 356 further connects to one end of element 358. The other end of element 358 connects to ground. The other end of element 360 connects to one end of both element 362 and element 366. The other end of element 362 further connects to one end of element 364. The other end of element 364 connects to ground. The other end of element 366 provides an output for use with additional satellite broadcast receiving circuits.

In order to improve the selectivity, the output sections of the filter sections are modified to add transmission zeros in the stopband frequency portion of the frequency response for the filter sections. In a preferred embodiment, elements 328, 334, 358, and 364 are used to create the transmission zeroes. In contrast to designs using full elliptic filters, the input portions of the filter sections remain as either Butterworth or Chebyshev designs without added transmission zeros. The unmodified portions of the filter sections act as buffers so that the added transmission zeros do not alter the input impedance of the filter sections significantly. The altering of the input impedance is often the cause of anomalies in the passbands of other connected filter sections. As a result, the introduction of the transmission zeroes in this manner does not introduce any unwanted circuit interactions and anomalies in the passbands. In some embodiments, the input return loss performance may be somewhat affected but a reasonable level of performance is still achieved.

Further, the introduction of the transmission zeroes in the stopband frequency range allow fewer circuit elements to be used to achieve a desired or required level of stopband frequency rejection. The fewer circuit elements reduce the order of the filter and further leads to lower transmission signal insertion loss through the filter section.

It is important to note that the location in frequency for the transmission in the stopband may affect the performance of the filter section. For example, when the added transmission zeros are placed near the cut off frequency, the return loss performance is adversely affected. To avoid this, the solution may include incorporating additional filter elements (e.g., elements used as part of a Butterworth or Chebyshev filter) to increase the filter order. The increased order provides additional selectivity and also provides additional isolation for the transmission zeros from the filter input.

In a preferred embodiment, one of the final elements (either a capacitor or inductor) in the filter section closest to the filter output has an inductor or capacitor, as appropriate, added, in parallel or in series, to produce a transmission zero in the stopband frequency range. The element values for the present and additional elements may be determined using a set of two simultaneous equations. The equations are solved such that the combination of the values of the two elements produces the same impedance at the cut off frequency as the present element and also produces a transmission zero in the stopband frequency range portion of the frequency response for the filter section. The combination values affect the passband performance in a minimal way. In addition, the ratio of the component values for the two elements can be experimentally adjusted by physical manipulation, computer simulation or computer optimization techniques to meet specific requirements for selectivity or stopband rejection and input signal return loss.

As a specific example, consider a shunt inductor in the output section of a high pass filter (e.g., element 362). The initial value is L1. To produce a resonant frequency as a stopband zero, w2, below the cutoff frequency for the filter, w1, a capacitor C1 is added in series. The new value, L2, can be calculated by equation 1:

$$L2 = L1 * (w1^2/(w1^2 - w2^2)) \quad (1)$$

The resonant frequency for the transmission zero stopband frequency range can be calculated by equation 2:

$$w2^2 = 1/(L2 * C1) \quad (2)$$

As a numerical example, a high pass filter has a cutoff frequency (w1) equal to 950 MHz. The filter has an original output shunt inductor (L1) with a value equal to 9.63 nanohenries (nH) is desired to be modified to produce a stopband zero at w2=800 MHz. The ratio $(w1^2/(w1^2-w2^2))$ is 3.44 resulting in the new value (L2) as 33.1 nH. The capacitor is chosen to resonate at 800 MHz (w2) resulting in a value of 1.2 picofarads (pF). It is important to note that a parallel capacitor can be added to a series inductor to place a stop band zero in a low pass filter in a manner similar to that described above.

The following table shows values for one exemplary embodiment of diplex filter 300.

TABLE 1

| ELEMENT | VALUE |
| --- | --- |
| 302 | 82 nanohenries |
| 304 | 220 picofarads |
| 306 | 8.2 picofarads |
| 308 | 39 nanohenries |
| 310 | 8.2 picofarads |
| 312 | 68 nanohenries |
| 314 | 33 picofarads |
| 316 | 22 picofarads |
| 320 | 22.2 nanohenries |
| 322 | 4.7 picofarads |
| 324 | 27.1 nanohenries |
| 326 | 4.6 picofarads |
| 328 | 0.8 picofarads |
| 330 | 18 nanohenries |
| 332 | 3.5 picofarads |
| 334 | 4.95 picofarads |
| 336 | 5.39 nanohenries |

TABLE 1-continued

| ELEMENT | VALUE |
| --- | --- |
| 350 | 1.5 picofarads |
| 352 | 7.14 nanohenries |
| 354 | 1.23 picofarads |
| 356 | 13.65 nanohenries |
| 358 | 3.95 picofarads |
| 360 | 1.347 picofarads |
| 362 | 33 nanohenries |
| 364 | 1.2 picofarads |
| 366 | 3.71 picofarads |

Figure 4:
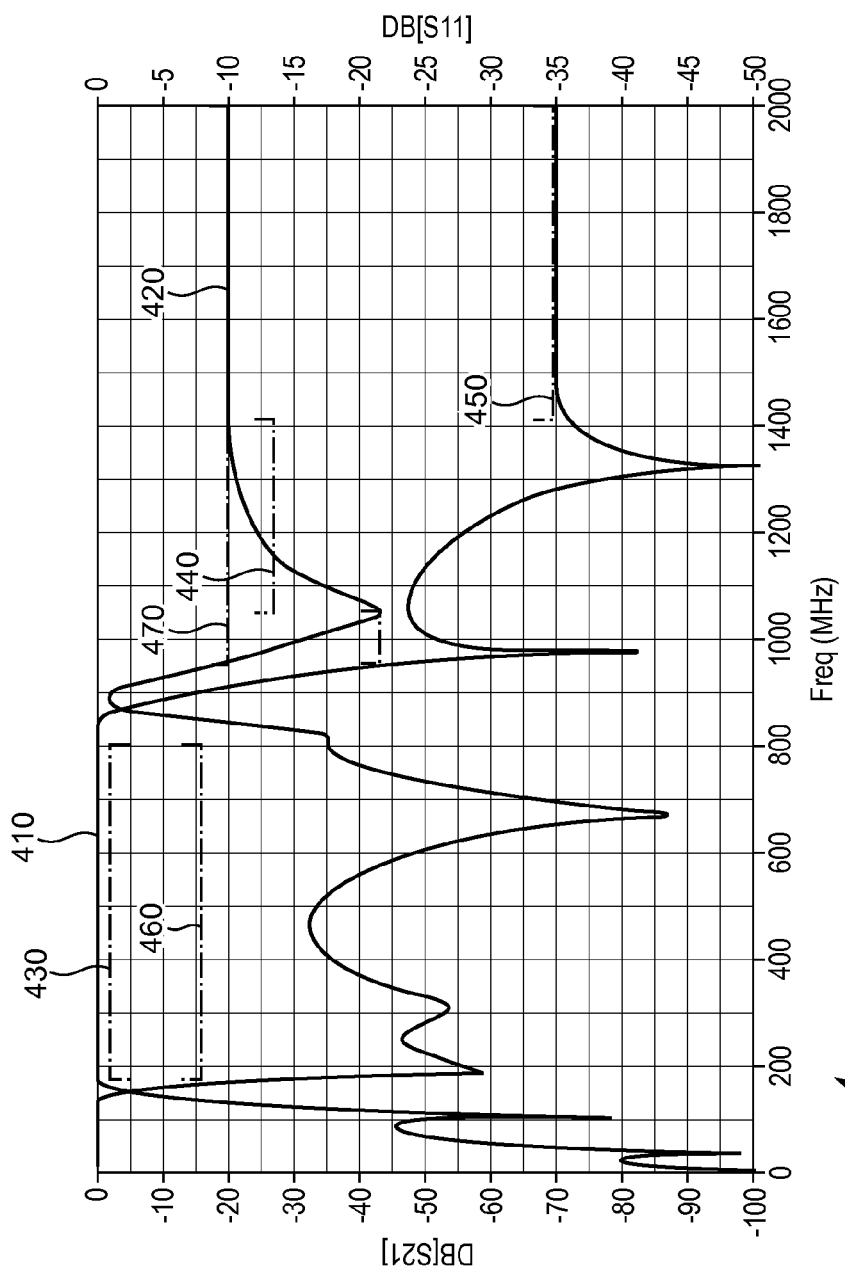
FIG. 4 is a diagram of a simulated signal response of the exemplary diplex filter as shown in FIG. 3 in accordance with the present disclosure.
Figure 5:
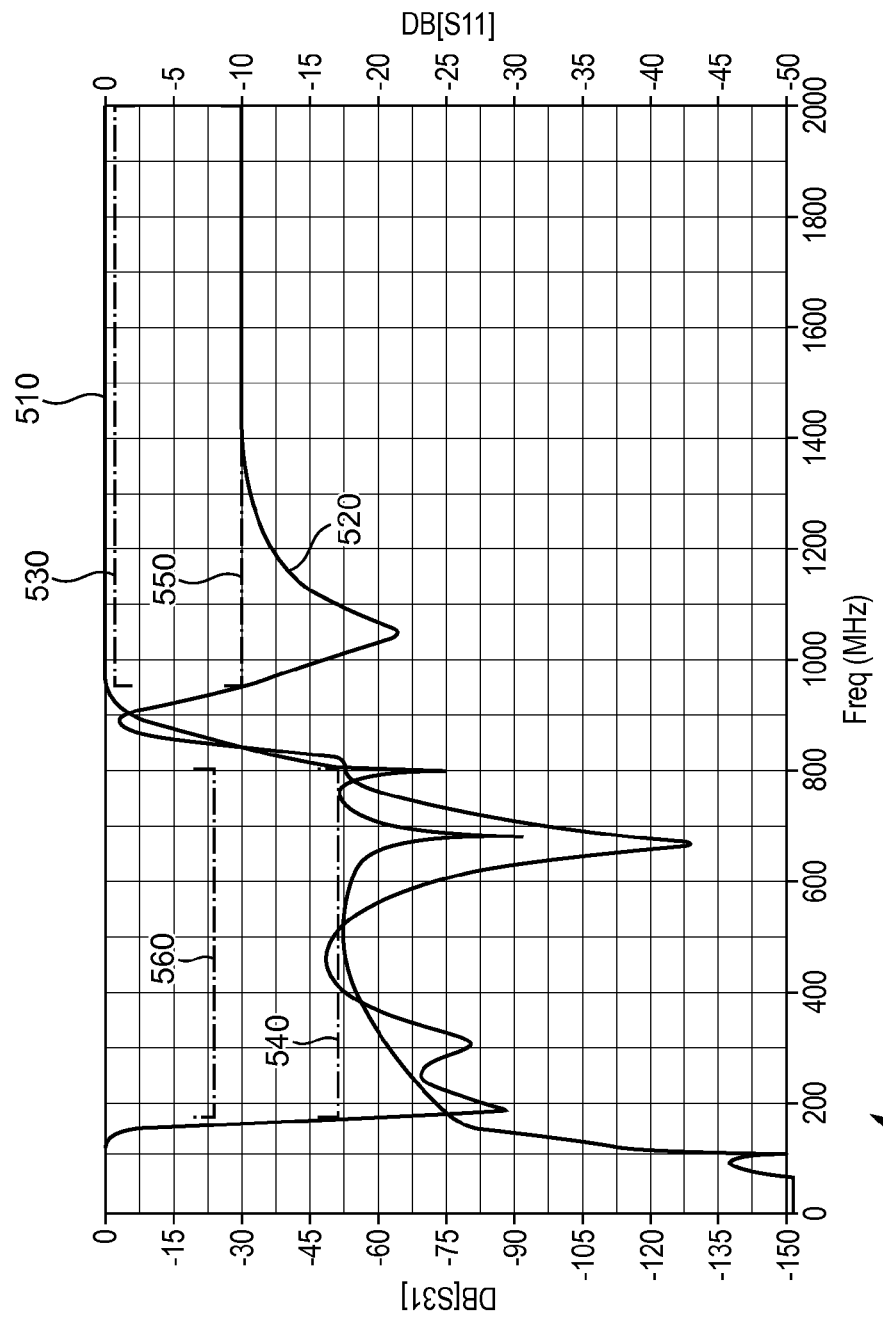
FIG. 5 is a diagram of another simulated signal response of the exemplary diplex filter as shown in FIG. 3 in accordance with the present disclosure.

FIG. 4 and FIG. 5 illustrate graphs showing the simulation results for the signal response characteristics of diplex filter 300 described in FIG. 3. Each of the graphs displays a frequency range on the x-axis and displays an amplitude associated with a response for the filter on the y axis. Each side of the graphs also shows a separate y axis scale.

More specifically, FIG. 4 illustrates a graph 400 that shows the forward transfer response for the terrestrial signal filter portion of diplex filter 300 (elements 302-336) as element 410 with a y axis scale shown on the left. Graph 400 also shows the input signal return loss as element 420 with a y axis scale on the right. Graph 400 also includes a set of elements illustrating design goals for the performance of the filter. Elements 430, 440, and 450 provide the design goal for the forward transfer response element 410. Elements 460 and 470 provide the design goal for the input signal return loss element 420.

FIG. 5 illustrates a graph 500 that shows the forward transfer response for the satellite signal filter portion of diplex filter 300 (elements 302-316 and 350-366) as element 510 with a y axis scale shown on the left. Graph 500 also shows the input signal return loss as element 520. Elements 530 and 540 provide the design goal for the forward transfer response element 510. Elements 550 and 560 provide the design goal for the input signal return loss element 520.

Figure 6:
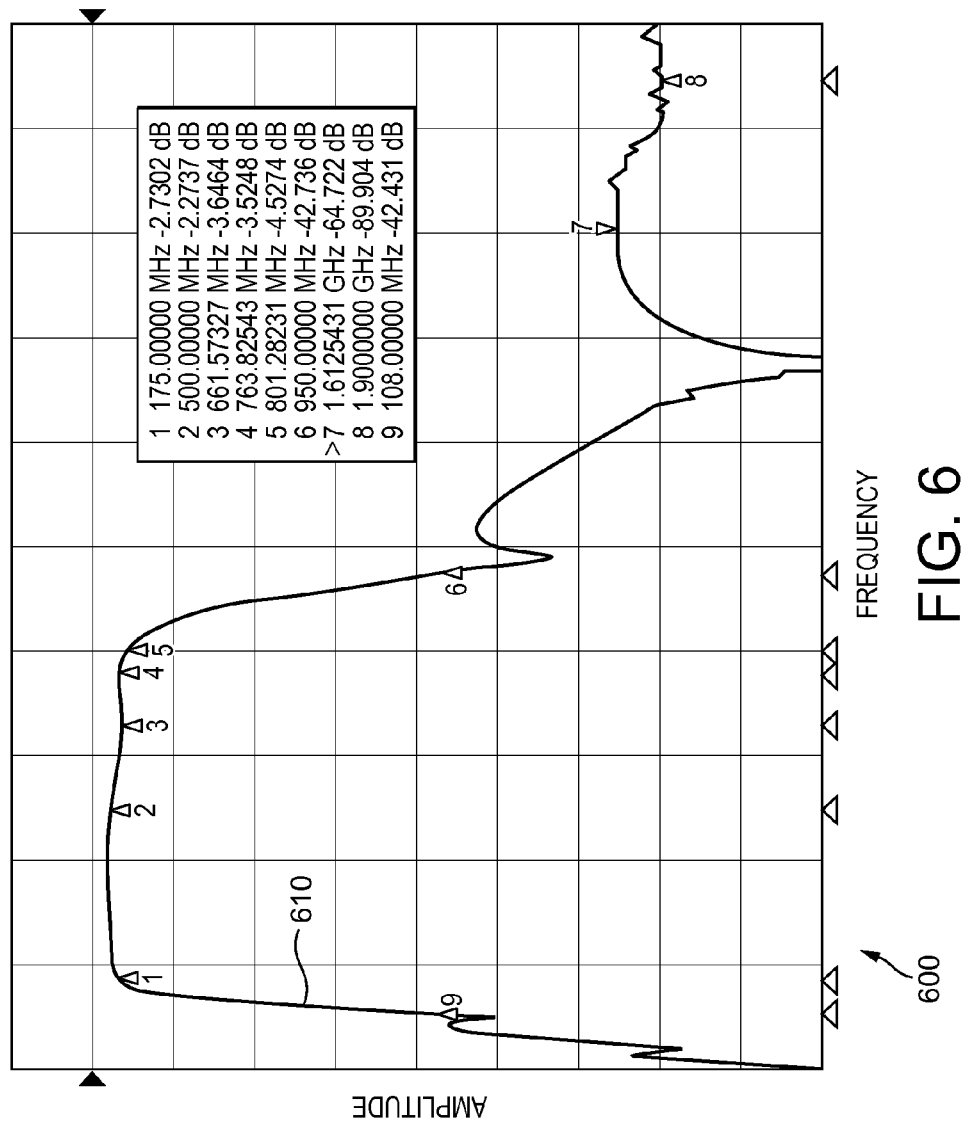
FIG. 6 is a diagram of a measured signal response of the exemplary diplex filter as shown in FIG. 3 in accordance with the present disclosure.
Figure 7:
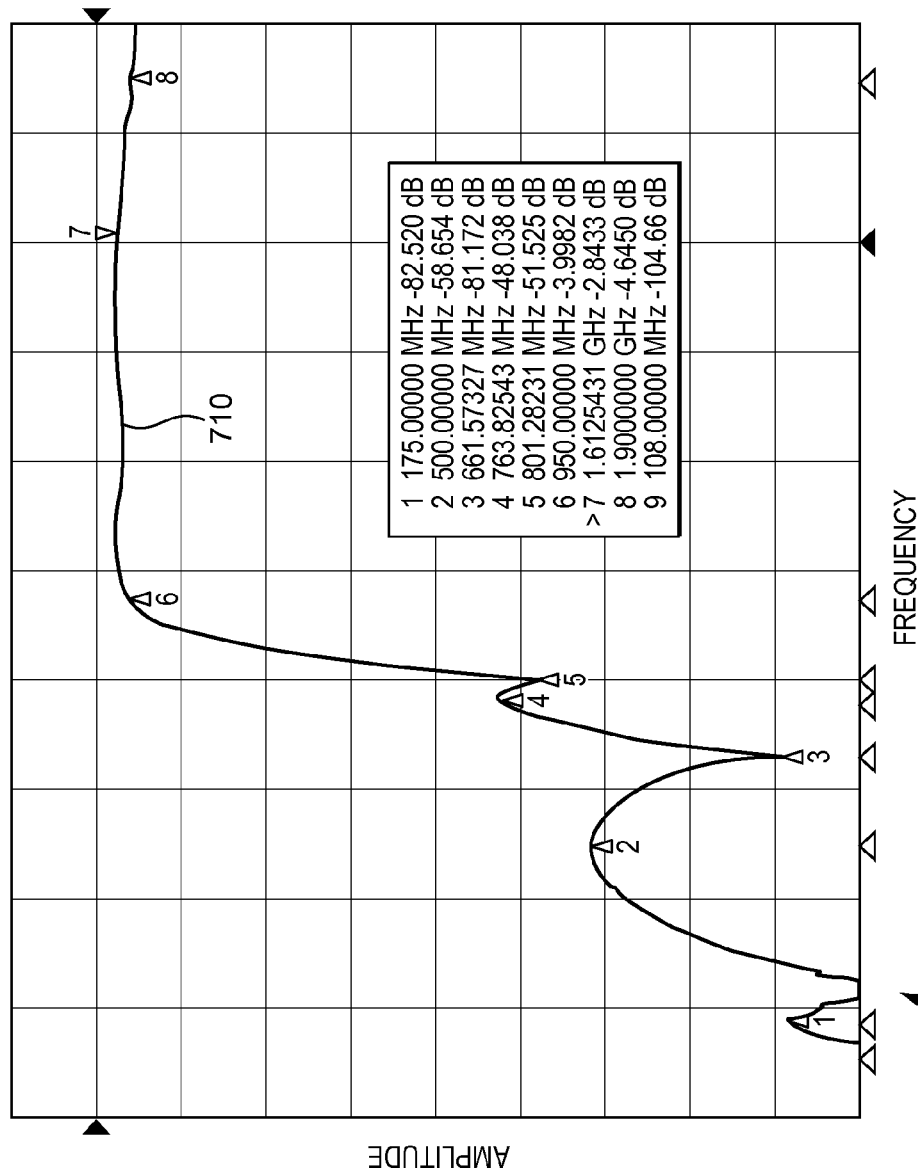
FIG. 7 is a diagram of another measured signal response of the exemplary diplex filter as shown in FIG. 3 in accordance with the present disclosure.
Figure 8:
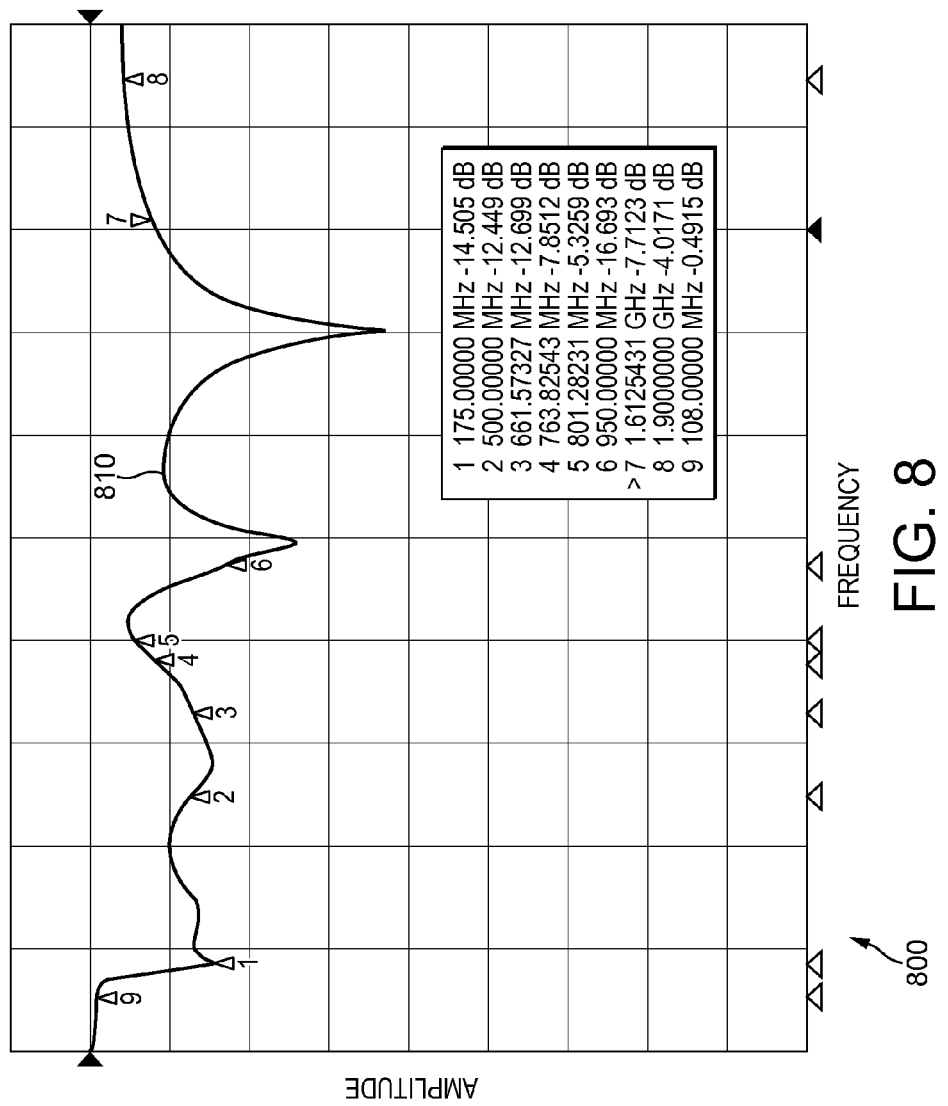
FIG. 8 is a diagram of a further measured signal response of the exemplary diplex filter as shown in FIG. 3 in accordance with the present disclosure.

FIGS. 6-8 show graphs illustrating actual test measurement results for diplex filter 300 described in FIG. 3. Several component values were modified to compensate for, among other things, the effect of the printed circuit board and other parasitic effects on the components used in the circuit. Importance is placed on adjusting element values to position the stopband zeros at the same frequencies as used during the original design simulation. Each of the graphs display a frequency range on the x-axis and display an amplitude associated with a response for the filter on the y axis.

FIG. 6 illustrates a graph 600 that shows the forward transfer response for the terrestrial signal filter portion of diplex filter 300 (elements 302-316 and elements 250-366) as element 610. Graph 600 also includes a set of marker elements, labeled 1-9, illustrating the performance of the filter at different frequencies.

FIG. 7 illustrates a graph 700 that shows the forward transfer response for the satellite signal filter portion of diplex filter 300 (elements 302-336) as element 710. Graph 700 also includes a set of marker elements, labeled 1-9, illustrating the performance of the filter at different frequencies.

FIG. 8 illustrates a graph 800 that shows the input signal return loss for diplex filter 300 as element 810. Graph 800 further includes a set of marker elements, labeled 1-9, illustrating the performance of the filter at different frequencies.

Figure 9:
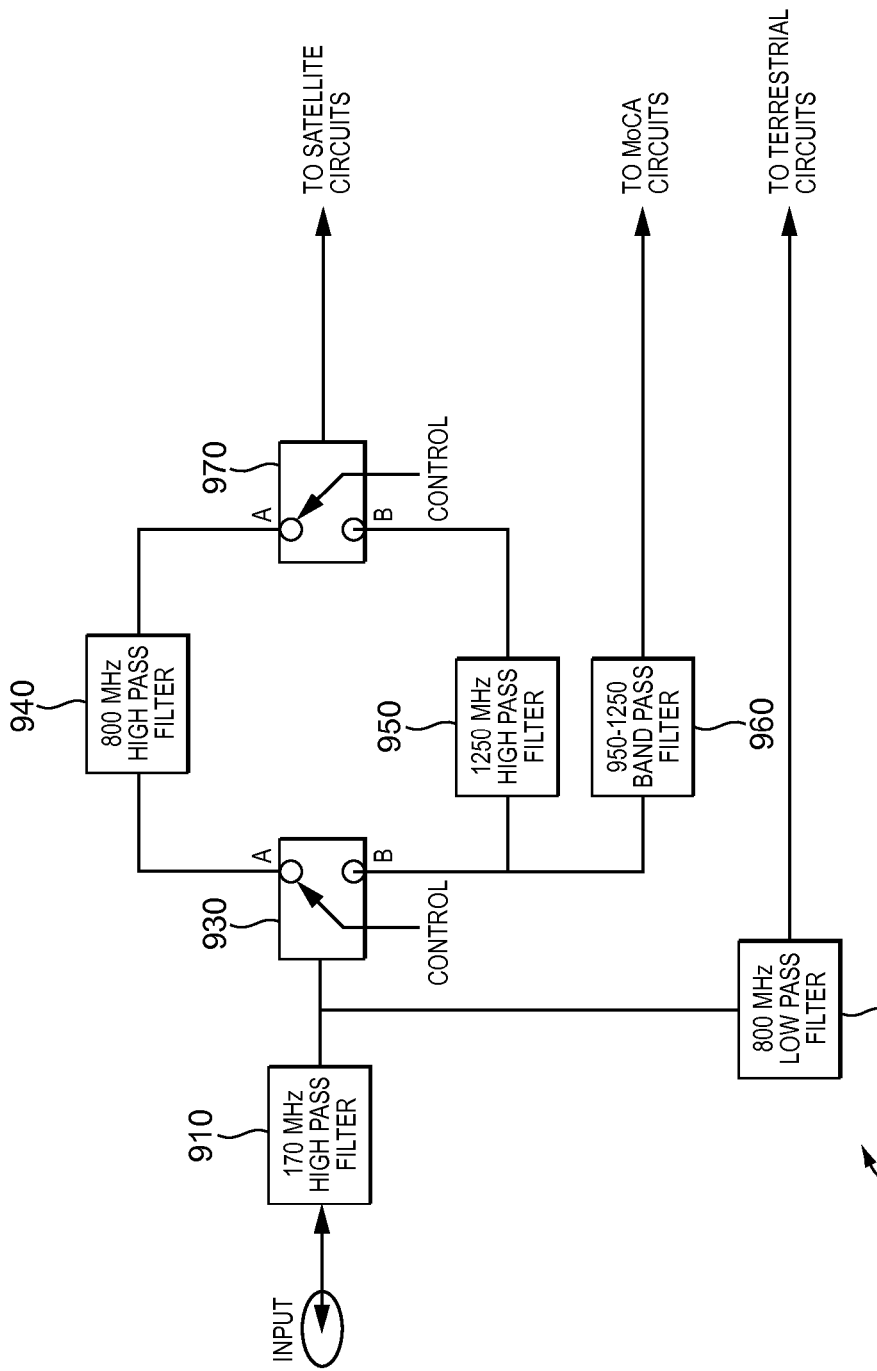
FIG. 9 is a block diagram of an exemplary multiplex filter used in accordance with the present disclosure.

Turning to FIG. 9, a block diagram of a multiplex filter 900 used in a receiving device according to aspects of the present disclosure is shown. Multiplex filter 900 may operate in a manner similar to filter 103 described in FIG. 1. More specifically multiplex filter operates in two modes and provides interfaces for a satellite broadcast signal service, a terrestrial or cable broadcast signal service, and a home networking communication service through a MoCA interface. Design aspects used in multiplex filter 900 are similar to the design aspects used in diplex filter 200 described in FIG. 2 and diplex filter 300 described in FIG. 3. In particular, diplex filter 900 also addresses issues related to achieving high selectivity in the stopband frequency range of one or more of the filter sections while minimizing the response interactions and anomalies between the filter sections.

Multiplex filter 900 includes high pass filter 910 connected to an input interface. The output of high pass filter 910 is connected to a low pass filter 920 and also to a switch 930. The output of low pass filter 920 is provided to other circuits for receiving terrestrial or cable broadcast signals. One output of switch 930 is connected to high pass filter 940. The other output of switch 930 connects to both high pass filter 950 and bandpass filter 960. The output of highpass filter 940 connects to one input of switch 970. The output of high pass filter 950 connects to a second input of switch 970. The output of switch 970 is provided to other circuits for receiving satellite broadcast signals. The output of bandpass filter 960 is an interface to other MoCA communication circuits. A control signal is provided to switch 930 and switch 970 from a separate controller or processor (not shown).

A signal at the input is provided to highpass filter 910. Highpass filter 910 allows signals in the frequency range above 170 MHz to pass through and rejects or reduces the presence of signals in the frequency range below 170 Mhz. The signals that pass through may include cable or terrestrial broadcast signals, satellite broadcast signals, and home network signals (e.g., MoCA network signals).

The output of highpass filter 910 is provided to lowpass filter 920. Lowpass filter 920 allows cable or terrestrial broadcast signals in the frequency range below 800 MHz to pass through and rejects or reduces the presence of signals above 800 MHz. The signals above 800 MHz may include satellite broadcast signals or home network signals (e.g., MoCA network signals). The output of highpass filter 910 is provided to further terrestrial or cable broadcast signal processing circuits (e.g., tuner 110 and link circuit 112 shown in FIG. 1).

The output of highpass filter 910 is also provided to switch 930. Switch 930 is a single pole double throw switch providing an output to one of two possible circuits. In a first switch position, labeled "A", switch 930 provides the signal from the output of highpass filter 910 to highpass filter 940. Highpass filter 940 allows satellite broadcast signals in the frequency range above 950 MHz to pass through and rejects or reduces the presence of signals below 950 MHz. The output of highpass filter 940 is provided to switch 970. Switch 970 also operates as a single pole double throw switch with one of two inputs routed to an output. The highpass filter 940 is connected to the switch terminal input labeled "A", the same as for switch 930.

In a second switch position, labeled "B", switch 930 provides the signal from the output of highpass filter 930 to highpass filter 950. Highpass filter 950 allows satellite broadcast signals in the frequency range above 1250 MHz to pass through and rejects or reduces the presence of signals below 1250 MHz. The output of highpass filter 950 is provided to the switch terminal labeled "B" on switch 970. The output of switch 970, either from highpass filter 940 or highpass filter 950, is provided to further satellite broadcast signal processing circuits (e.g., tuner 105 and link circuit 106 shown in FIG. 1).

Switch 930, in switch position labeled "B", also provides the signal from the output of highpass filter 930 to bandpass filter 960. Bandpass filter 960 allows home network signals in the frequency range between 950 MHz and 1250 MHz to pass through and rejects or reduces the presence of signals below 950 MHz and above 1250 MHz. The output of bandpass filter 960 is provided to further home network processing circuits (e.g., MoCA Circuit 134 shown in FIG. 1). In some embodiments, the home network signal may be bidirectional, with signals from the home network processing circuits also passing through bandpass filter 960, switch 930, and highpass filter 910 to the input connector.

It is important to note that although switch 930 and switch 970 are shown as separate switches, switch 930 and switch 970 may be combined into one switch as a double pole double throw switch. Further, the switch control for both switch 930 and switch 960 may be common, with the switch position for both switch 930 and switch 970 either in position labeled "A" or in position labeled "B".

Multiplex filter 900 includes features that allow for more than one signal receiving system to be used. In particular, the switch configuration using switch 930 and switch 970 allows multiplex filter 900 to be used in a receiving device capable of operating in a system that may include a satellite signal in the frequency range above 950 MHz in a first operating mode. Multiplex filter 900 may also operate in a system that may include a satellite signal in the frequency range above 1250 MHz along with operating in a home network system with signals in the frequency range from 950 MHz to 1250 MHz.

Any of the filters described in multiplex filter 900 may utilize aspects described earlier for the hybrid filter design. In particular, any or all of lowpass filter 920, highpass 940, highpass filter 950, and bandpass filter 960 may use a singly terminated filter based on the Butterworth or Chebyshev design and include additional transmission zeroes in the stopband frequency range for the filters as described earlier.

Figure 10:
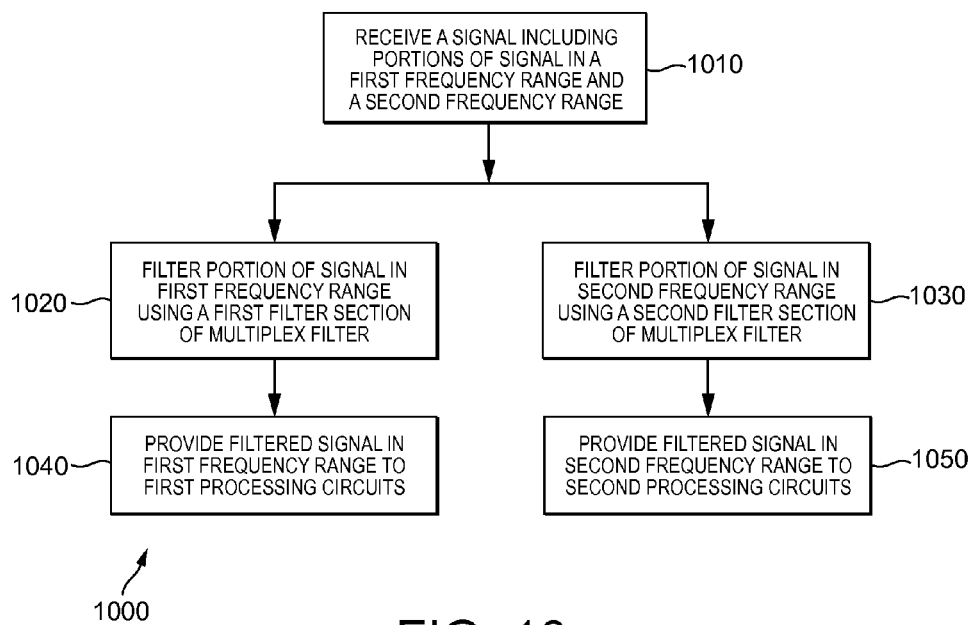
FIG. 10 is a flowchart showing an exemplary process for filtering a signal in a receiver in accordance with the present disclosure.

Turning now to FIG. 10, a flowchart of an exemplary process 1000 for filtering a signal in a receiver in accordance with the present disclosure is shown. Process 1000 will primarily be described with respect to diplex filter 200 described in FIG. 2. The steps of process 1000 may equally apply to the diplex filter 300 in FIG. 3 or the multiplex filter 900 in FIG. 9. Additionally, one or more of the steps in process 1000 may be equally applicable to filter 103 in FIG. 1. Further, it is important to note that some of the steps described in process 1000 may be implemented more than once, may be implemented recursively, or may be omitted. Such modifications may be made without any effect to the overall aspects of process 1000.

At step 1010, a signal is received at the input of a filter, such as diplex filter 200. The signal received, at step 1010, may be comprised of different signals from a plurality of signal sources or service providers. The different signals may occupy different portions of the frequency spectrum or frequency ranges. The different portions of the signal are provided by one or more sources or service providers and represent broadcast audio and video programs and content arranged in channels. For example, a first portion of the received signal in a high frequency range, such as 950 MHz to 2,150 MHz, may be delivered from one or more satellites and a second portion of the received signal in a low frequency range, such as 170 MHz to 800 MHz, may be delivered from multiple television broadcast transmission sites.

At step 1020, the received signal is filtered to separate the first portion of signal from the remaining signal. The filtering, at step 1020, is performed by a first filter section included as part of a multiplex filter structure, such as diplex filter 200. In a preferred embodiment, the first filter section is a highpass filter that operates by passing a satellite signal in the range from 950 MHz to 2,150 MHz through to additional satellite signal receiving circuits and attenuating a cable or terrestrial broadcast signal operating in the frequency range from 170 MHz to 800 MHz. The filtering, at step 1020, is performed with a filter section that includes a hybrid design that has improved selectivity or stopband frequency rejection. In the embodiment, the filtering, at step 1020, may include a single terminated filter designed using a Butterworth or Chebyshev design that also includes additional elements to form additional transmission stopband frequency zeroes in the frequency response.

At step 1030, the received signal is filtered to separate the second portion of the signal from the remaining signal. The filtering, at step 1030, is performed by a second filter section included as part of a multiplex filter structure, such as diplex filter 200. In a preferred embodiment, the first filter section is a lowpass filter that operates by passing a terrestrial or cable signal in the range from 170 MHz to 800 MHz through to additional terrestrial or cable signal receiving circuits and attenuating a satellite broadcast signal operating in the frequency range from 950 MHz to 2,150 MHz. As in step 1020, the filtering, at step 1030, is performed with a second filter section that includes a hybrid design that has improved selectivity or stopband frequency rejection. In the embodiment, the filtering, at step 1030, may include a single terminated filter designed using a Butterworth or Chebyshev design that also includes additional elements to form additional transmission stopband frequency zeroes in the frequency response.

As noted above, the filtering, at step 1020, and filtering, at step 1030, is performed using a multiplex filter that includes a hybrid filter design approach. The filter sections use additional elements to form transmission frequency zeroes in the stopband frequency range such that the transmission frequency zeroes minimize the effect on the passband frequency response on the first filter section and the second filter section. The elements are placed in a location in the filter that is a maximum distance electrically from the common connection point for the filter sections in the multiplex filter.

At step 1040, the output signal from the first filter portion of the multiplex filter structure is provided to a first signal processing circuit. The first signal processing circuit may containing a tuner, link circuit, and transport decoder for processing a signal in the first frequency range (e.g., tuner 105, link circuit 106, and transport decoder 108 described in FIG. 1). At step 1050, the output signal from the second filter portion of the multiplex filter structure is provided to a second signal processing circuit. The second signal processing circuit may containing a tuner, link circuit, and transport decoder for processing a signal in the second frequency range (e.g., tuner 110, link circuit 112, and transport decoder 114 described in FIG. 1). Each processing circuit may perform similar processing on the filtered signal streams, the processing being specific to the transmission protocol used.

The frequency multiplex circuit embodiments described above may be designed initially using conventional techniques of single terminated Butterworth or Chebyshev filters with a further addition for transmission zeros in the sections at or near the outputs of one or more of the filter sections (furthest from the common interface connection). In other words, circuit elements that are located in the filter circuit closer to the output of the filter than to the input of the filter are added and/or adjusted to form the transmission zeros. The circuit elements that are located closer to the input of the filter act as buffers so that the added transmission zeros do not alter the input impedance of the filters significantly. Transmission zeros are not added to the input filter section. The transmission zeros are added to substantially provide the same reactance to the filter at the cut off frequency for the filter response from the affected original filter element. This technique may be applied to multiplex filters employing bandpass sections as well, such as a filter section included for filtering a home network signal (e.g., MoCA signal).

The embodiments of the present disclosure describe a method and apparatus for filtering a signal in a receiver. In particular, the embodiments describe a filter design that provides a high level of rejection for signals from a service in one frequency range while passing signals from a service in a second frequency range. The embodiments relate to a filter design used as part of a diplexer or multiplexer filter structure. These structures are common in designs that must operate with and receive signals in separate frequency ranges. Design requirements resulting from constraints imposed by the system may include simultaneously meeting a low insertion loss in the passband frequency range of each filter section, a high stop-band frequency rejection ratio in each filter section, and a nominal input return loss over both passband frequency regions. The design employs the use of singly terminated filters for each filter section in the multiplexer. The design further modifies or augments the singly terminated filters by including stopband frequency zeros in the frequency response using additional elements in conjunction with the elements in the filter sections that are electrically furthest from the common terminal connecting the filter sections. The unconventional placement of these stopband frequency zeroes in the filter structure permits the frequency response in the stopband region of each section to be augmented without the addition of further filter sections and without impacting the return loss or creating other frequency response anomalies measured at the common terminal of the diplexer.

Although embodiments which incorporate the teachings of the present disclosure have been shown and described in detail herein, those skilled in the art can readily devise many other varied embodiments that still incorporate these teachings. Having described preferred embodiments of a method and apparatus for filtering a signal in a receiver in accordance with the present disclosure (which are intended to be illustrative and not limiting), it is noted that modifications and variations can be made by persons skilled in the art in light of the above teachings. It is therefore to be understood that changes may be made in the particular embodiments of the present disclosure which are within the scope of the disclosure as outlined by the appended claims.

What is claimed is:

1. An apparatus comprising:
a first filter, the first filter being singly terminated with respect to one of an input and an output of the first filter, the first filter filtering a received signal in a first frequency range; and
a second filter, the second filter being singly terminated with respect to one of an input and an output of the second filter, the input of the second filter being connected to the input of the first filter, the second filter filtering the received signal in a second frequency range, wherein the first frequency range is above the second frequency range and least one element of the first filter is coupled to an additional element to form a frequency response transmission zero in a stopband frequency range of the first filter.

2. The apparatus of claim 1, wherein the at least one element is located near the output of the first filter.

3. The apparatus of claim 1, wherein the first filter includes a first plurality of series elements and a first plurality of shunt elements arranged in a ladder structure.

4. The apparatus of claim 3, wherein the second filter includes a second plurality of series elements and a second plurality of shunt elements arranged in a ladder structure.

5. The apparatus of claim 4, wherein at least one element of the second plurality of shunt elements of the second filter has an additional shunt element added to form a frequency response transmission zero in a stopband frequency range of the second filter, the at least one element being located at the output of the second filter.

6. The apparatus of claim 1, wherein the first filter and the second filter are at least one of a singly terminated Butterworth filter and a singly terminated Chebyshev filter.

7. The apparatus of claim 1, wherein the first frequency range is 950 Megahertz to 2,150 Megahertz and the second frequency range is 170 Megahertz to 800 Megahertz.

8. The apparatus of claim 1, wherein the second filter further includes a highpass filter and a lowpass filter for filtering the input signal.

9. The apparatus of claim 1, wherein the input signal in the first frequency range contains media program content that is received from a satellite signal service provider and the input signal in the second frequency range contains media program content that is received from at least one of a terrestrial signal service provider and a cable signal service provider.

10. The apparatus of claim 1, further comprising a third filter that filters a signal used in a multimedia over cable alliance network.

11. A method comprising:
receiving a signal, the signal containing content in a first frequency range and content in a second frequency range, the first frequency range being above the second frequency range;
applying filtering, using first processing circuitry, to the received signal to produce a first output signal containing the content in the first frequency range; and
applying filtering, using second processing circuitry coupled to the first processing circuitry, to the received signal to produce a second output signal containing the content in the second frequency range,
wherein at least one of the first processing circuitry and the second processing circuitry uses a filter that includes a singly terminated filter section with additional circuit elements to form a frequency response transmission zero in a stopband frequency range of the filter.

12. The method of claim 11, wherein the additional circuit elements are located near the output of the filter section of at least one of the first processing circuitry and the second processing circuitry.

13. The method of claim 11, wherein the singly terminated filter section includes a plurality of series elements and a plurality of shunt elements arranged in a ladder structure.

14. The method of claim 13, wherein at least one element of the plurality of shunt elements of the singly terminated filter section has an additional shunt element added to form the frequency response transmission zero, the at least one element being located at the output of the singly terminated filter section.

15. The method of claim 11, wherein the singly terminated filter section is at least one of a singly terminated Butterworth filter and a singly terminated Chebyshev filter.

16. The method of claim 11, wherein the first frequency range is 950 Megahertz to 2,150 Megahertz and the second frequency range is 170 Megahertz to 800 Megahertz.

17. The method of claim 11, wherein the second processing circuitry further includes a highpass filter and a lowpass filter for filtering the input signal.

18. The method of claim 11, wherein the content in the first frequency range is received from a satellite signal service provider and the content in the second frequency range is received from at least one of a terrestrial signal service provider and a cable signal service provider.

19. An apparatus comprising:
means for receiving a signal, the signal containing content in a first frequency range and content in a second frequency range, the first frequency range being above the second frequency range;
first means for filtering the received signal to produce a first output signal containing the content in the first frequency range; and
second means for filtering the received signal to produce a second output signal containing the content in the second frequency range,
wherein at least one of the first means for filtering and the second means for filtering uses a filter that includes a singly terminated filter section with additional circuit elements to form a frequency response transmission zero in a stopband frequency range of the at one of the first means for filtering and the second means for filtering.

20. The apparatus of claim 19, wherein the additional circuit elements are located near the output of the filter section of at least one of the first processing circuitry and the second processing circuitry.

21. The apparatus of claim 19, wherein the singly terminated filter section includes a plurality of series elements and a plurality of shunt elements arranged in a ladder structure.

22. The apparatus of claim 21, wherein at least one element of the plurality of shunt elements of the singly terminated filter section has an additional shunt element added to form the frequency response transmission zero, the at least one element being located at the output of the singly terminated filter section.

23. The apparatus of claim 19, wherein the singly terminated filter section is at least one of a singly terminated Butterworth filter and a singly terminated Chebyshev filter.

24. The apparatus of claim 19, wherein the first frequency range is 950 Megahertz to 2,150 Megahertz and the second frequency range is 170 Megahertz to 800 Megahertz.

25. The apparatus of claim 24, wherein the second means for filtering further includes a highpass filter and a lowpass filter for filtering the input signal.

26. The apparatus of claim 19, wherein the content in the first frequency range is received from a satellite signal service provider and the content in the second frequency range is received from at least one of a terrestrial signal service provider and a cable signal service provider.

27. The apparatus of claim 19, further comprising a third means for filtering the received signal to produce a signal used in a multimedia over cable alliance network.

28. The method of claim 11, further comprising applying filtering, using third processing circuitry coupled to the first processing circuitry and second processing circuitry, to the received signal to produce a signal used in a multimedia over cable alliance network.

29. An apparatus comprising:
a first filter, the first filter being singly terminated with respect to one of an input and an output of the first filter, the first filter filtering a received signal in a first frequency range; and
a second filter, the second filter being singly terminated with respect to one of an input and an output of the second filter, the input of the second filter being connected to the input of the first filter, the second filter filtering the received signal in a second frequency range,
wherein the first filter and the second filter are at least one of a singly terminated Butterworth filter and a singly terminated Chebyshev filter and at least one element of the first filter is coupled to an additional element to form a frequency response transmission zero in a stopband frequency range of the first filter.

30. The apparatus of claim 29, wherein the input signal in the first frequency range contains media program content that is received from a satellite signal service provider and the input signal in the second frequency range contains media program content that is received from at least one of a terrestrial signal service provider and a cable signal service provider.

31. The apparatus of claim 29, further comprising a third filter that filters a signal used in a multimedia over cable alliance network.

32. An apparatus comprising:
a first filter, the first filter being singly terminated with respect to one of an input and an output of the first filter, the first filter filtering a received signal in a first frequency range; and
a second filter, the second filter being singly terminated with respect to one of an input and an output of the second filter, the input of the second filter being connected to the input of the first filter, the second filter filtering the received signal in a second frequency range, the second filter further includes a highpass filter and a lowpass filter for filtering the input signal,
wherein at least one element of the first filter is coupled to an additional element to form a frequency response transmission zero in a stopband frequency range of the first filter.

33. The apparatus of claim 32, wherein the input signal in the first frequency range contains media program content that is received from a satellite signal service provider and the input signal in the second frequency range contains media program content that is received from at least one of a terrestrial signal service provider and a cable signal service provider.

34. The apparatus of claim 32, further comprising a third filter that filters a signal used in a multimedia over cable alliance network.

35. An apparatus comprising:
a first filter, the first filter being singly terminated with respect to one of an input and an output of the first filter, the first filter filtering a received signal in a first frequency range;
a second filter, the second filter being singly terminated with respect to one of an input and an output of the second filter, the input of the second filter being connected to the input of the first filter, the second filter filtering the received signal in a second frequency range; and
a third filter that filters a signal used in a multimedia over cable alliance network,
wherein at least one element of the first filter is coupled to an additional element to form a frequency response transmission zero in a stopband frequency range of the first filter.

36. The apparatus of claim 35, wherein the at least one element is located near the output of the first filter.

37. The apparatus of claim 35, wherein the first filter includes a first plurality of series elements and a first plurality of shunt elements arranged in a ladder structure.

38. The apparatus of claim 35, wherein the second filter includes a second plurality of series elements and a second plurality of shunt elements arranged in a ladder structure.

39. The apparatus of claim 35, wherein at least one element of the second plurality of shunt elements of the second filter has an additional shunt element added to form a frequency response transmission zero in the stopband frequency range of the second filter, the at least one element being located at the output of the second filter.

40. The apparatus of claim 35, wherein the input signal in the first frequency range contains media program content that is received from a satellite signal service provider and the input signal in the second frequency range contains media program content that is received from at least one of a terrestrial signal service provider and a cable signal service provider.

41. A method comprising:
receiving a signal, the signal containing content in a first frequency range and content in a second frequency range, the second frequency range being different than the first frequency range;
applying filtering, using first processing circuitry, to the received signal to produce a first output signal containing the content in the first frequency range; and
applying filtering, using second processing circuitry coupled to the first processing circuitry, to the received signal to produce a second output signal containing the content in the second frequency range,
wherein at least one of the first processing circuitry and the second processing circuitry uses a filter that includes a singly terminated filter section with additional circuit elements to form a frequency response transmission zero in a stopband frequency range of the filter and the singly terminated filter section is at least one of a singly terminated Butterworth filter and a singly terminated Chebyshev filter.

42. The method of claim 41, wherein the content in the first frequency range is received from a satellite signal service provider and the content in the second frequency range is received from at least one of a terrestrial signal service provider and a cable signal service provider.

43. The method of claim 42, further comprising applying filtering, using third processing circuitry coupled to the first processing circuitry and second processing circuitry, to the received signal to produce a signal used in a multimedia over cable alliance network.

44. A method comprising:
receiving a signal, the signal containing content in a first frequency range and content in a second frequency range, the second frequency range being different than the first frequency range;
applying filtering, using first processing circuitry, to the received signal to produce a first output signal containing the content in the first frequency range; and
applying filtering, using second processing circuitry coupled to the first processing circuitry, to the received signal to produce a second output signal containing the content in the second frequency range,
wherein at least one of the first processing circuitry and the second processing circuitry uses a filter that includes a singly terminated filter section with additional circuit elements to form a frequency response transmission zero in a stopband frequency range of the filter and the second processing circuitry further includes a highpass filter and a lowpass filter for filtering the input signal.

45. The method of claim 44, wherein the content in the first frequency range is received from a satellite signal service provider and the content in the second frequency range is received from at least one of a terrestrial signal service provider and a cable signal service provider.

46. The method of claim 44, further comprising applying filtering, using third processing circuitry coupled to the first processing circuitry and second processing circuitry, to the received signal to produce a signal used in a multimedia over cable alliance network.

47. A method comprising:
receiving a signal, the signal containing content in a first frequency range and content in a second frequency range, the second frequency range being different than the first frequency range;
applying filtering, using first processing circuitry, to the received signal to produce a first output signal containing the content in the first frequency range;
applying filtering, using second processing circuitry coupled to the first processing circuitry, to the received signal to produce a second output signal containing the content in the second frequency range; and
applying filtering, using third processing circuitry coupled to the first processing circuitry and second processing circuitry, to the received signal to produce a signal used in a multimedia over cable alliance network,
wherein at least one of the first processing circuitry and the second processing circuitry uses a filter that includes a singly terminated filter section with additional circuit elements to form a frequency response transmission zero in a stopband frequency range of the filter.

48. The method of claim 47, wherein the additional circuit elements are located near the output of the filter section of at least one of the first processing circuitry and the second processing circuitry.

49. The method of claim 47, wherein the singly terminated filter section includes a plurality of series elements and a plurality of shunt elements arranged in a ladder structure.

50. The method of claim 47, wherein at least one element of the plurality of shunt elements of the singly terminated filter section has an additional shunt element added to form the frequency response transmission zero, the at least one element being located at the output of the singly terminated filter section.

51. The method of claim 47, wherein the content in the first frequency range is received from a satellite signal service provider and the content in the second frequency range is received from at least one of a terrestrial signal service provider and a cable signal service provider.

52. An apparatus comprising:
means for receiving a signal, the signal containing content in a first frequency range and content in a second frequency range, the second frequency range being different than the first frequency range;
first means for filtering the received signal to produce a first output signal containing the content in the first frequency range; and
second means for filtering the received signal to produce a second output signal containing the content in the second frequency range,
wherein at least one of the first means for filtering and the second means for filtering uses a filter that includes a singly terminated filter section with additional circuit elements to form a frequency response transmission zero in a stopband frequency range of the at one of the first means for filtering and the second means for filtering and the singly terminated filter section is at least one of a singly terminated Butterworth filter and a singly terminated Chebyshev filter.

53. The apparatus of claim 52, wherein the content in the first frequency range is received from a satellite signal service provider and the content in the second frequency range is received from at least one of a terrestrial signal service provider and a cable signal service provider.

54. The apparatus of claim 52, further comprising a third means for filtering the received signal to produce a signal used in a multimedia over cable alliance network.

55. An apparatus comprising:
  means for receiving a signal, the signal containing content in a first frequency range and content in a second frequency range, the second frequency range being different than the first frequency range;
  first means for filtering the received signal to produce a first output signal containing the content in the first frequency range; and
  second means for filtering the received signal to produce a second output signal containing the content in the second frequency range,
  wherein at least one of the first means for filtering and the second means for filtering uses a filter that includes a singly terminated filter section with additional circuit elements to form a frequency response transmission zero in a stopband frequency range of the at one of the first means for filtering and the second means for filtering and the second means for filtering further includes a highpass filter and a lowpass filter for filtering the input signal.

56. The apparatus of claim 55, wherein the content in the first frequency range is received from a satellite signal service provider and the content in the second frequency range is received from at least one of a terrestrial signal service provider and a cable signal service provider.

57. The apparatus of claim 55, further comprising a third means for filtering the received signal to produce a signal used in a multimedia over cable alliance network.

58. An apparatus comprising:
  means for receiving a signal, the signal containing content in a first frequency range and content in a second frequency range, the second frequency range being different than the first frequency range;
  first means for filtering the received signal to produce a first output signal containing the content in the first frequency range;
  second means for filtering the received signal to produce a second output signal containing the content in the second frequency range; and
  a third means for filtering the received signal to produce a signal used in a multimedia over cable alliance network,
  wherein at least one of the first means for filtering and the second means for filtering uses a filter that includes a singly terminated filter section with additional circuit elements to form a frequency response transmission zero in a stopband frequency range of the at one of the first means for filtering and the second means for filtering.

59. The apparatus of claim 58, wherein the additional circuit elements are located near the output of the filter section of at least one of the first processing circuitry and the second processing circuitry.

60. The apparatus of claim 58, wherein the singly terminated filter section includes a plurality of series elements and a plurality of shunt elements arranged in a ladder structure.

61. The apparatus of claim 60, wherein at least one element of the plurality of shunt elements of the singly terminated filter section has an additional shunt element added to form the frequency response transmission zero, the at least one element being located at the output of the singly terminated filter section.

62. The apparatus of claim 58, wherein the content in the first frequency range is received from a satellite signal service provider and the content in the second frequency range is received from at least one of a terrestrial signal service provider and a cable signal service provider.

* * * * *